United States Patent
Leuther et al.

(10) Patent No.: US 9,263,248 B2
(45) Date of Patent: Feb. 16, 2016

(54) PSEUDO-SUBSTRATE FOR USE IN THE PRODUCTION OF SEMICONDUCTOR COMPONENTS AND METHOD FOR PRODUCING A PSEUDO-SUBSTRATE

(75) Inventors: Arnulf Leuther, Bollschweil (DE); Axel Tessmann, Gundelfingen (DE); Rainer Losch, Boetzingen (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 230 days.

(21) Appl. No.: 13/817,567

(22) PCT Filed: Aug. 10, 2011

(86) PCT No.: PCT/EP2011/004001
§ 371 (c)(1),
(2), (4) Date: Feb. 19, 2013

(87) PCT Pub. No.: WO2012/022442
PCT Pub. Date: Feb. 23, 2012

(65) Prior Publication Data
US 2013/0143038 A1    Jun. 6, 2013

(30) Foreign Application Priority Data
Aug. 19, 2010 (DE) .......................... 10 2010 034 886

(51) Int. Cl.
*B32B 9/00* (2006.01)
*G11B 11/105* (2006.01)
(Continued)

(52) U.S. Cl.
CPC ............... *H01L 21/02* (2013.01); *C23C 16/06* (2013.01); *H01L 21/0251* (2013.01);
(Continued)

(58) Field of Classification Search
CPC .............. H01L 21/02; H01L 21/02395; H01L 21/02463; H01L 21/02466; H01L 21/02502; H01L 21/0251; H01L 21/0254; H01L 21/02631; H01L 21/02104; C23C 16/06

USPC .............. 117/103, 104, 108; 427/123, 126.1, 427/404, 419.1, 402; 428/220, 332, 697, 428/699
See application file for complete search history.

(56) References Cited

U.S. PATENT DOCUMENTS 5,770,868 A * 6/1998 Gill et al. ................ 257/190

FOREIGN PATENT DOCUMENTS

| DE | 69631662 | 7/2004 |
|---|---|---|
| WO | 9717723 | 5/1997 |
| WO | 9914809 | 3/1999 |

OTHER PUBLICATIONS

Andrews et al., "Liquid-phase epitaxial growth of stepwise-graded InAs1-x Sb x-InAs heterostructures", J. Vac. Sci. Technol., vol. 13, (1976), pp. 961-963.*

(Continued)

Primary Examiner — Jonathan Langman
(74) Attorney, Agent, or Firm — Volpe and Koenig, P.C.

(57) ABSTRACT

A pseudo-substrate (1, 11) for use in the production of semiconductor components, having a carrier substrate (2, 12) with a crystalline structure and a first buffer (3, 13), which is arranged on a surface of the carrier substrate (2, 12), if appropriate on further intervening intermediate layers, wherein the first buffer (3, 13) is embodied as a single layer or as a multilayer system and includes, at least at the surface facing away from the carrier substrate (2, 12), arsenic (As) and at least one of the elements aluminum (Al) and indium (In). The invention is characterized in that a second buffer (4, 14) is additionally arranged on a side of the first buffer (3, 13) facing away from the carrier substrate (2, 12), if appropriate on further intervening intermediate layers, said second buffer being embodied as a single layer or as a multilayer system, wherein the second buffer (4, 14) is embodied such that it includes, at a first surface facing the first buffer (3, 13) arsenic and at least one of the elements aluminum and indium and comprises, at a second surface facing away from the first buffer (3, 13) antimony (Sb) and at least one of the elements aluminum and indium, and wherein the second buffer is embodied with a decreasing proportion of arsenic and with an increasing proportion of antimony in each case proceeding from the first surface towards the second surface. The invention furthermore relates to a method for producing a pseudo-substrate (1, 11).

17 Claims, 3 Drawing Sheets

(51) Int. Cl.
*B32B 27/32* (2006.01)
*B32B 19/00* (2006.01)
*B05D 5/12* (2006.01)
*B05D 1/36* (2006.01)
*B05D 7/00* (2006.01)
*C30B 23/00* (2006.01)
*C30B 25/00* (2006.01)
*C30B 28/12* (2006.01)
*C30B 28/14* (2006.01)
*H01L 21/02* (2006.01)
*C23C 16/06* (2006.01)
*H01L 29/201* (2006.01)
*H01L 29/205* (2006.01)
*H01L 29/207* (2006.01)
*H01L 29/778* (2006.01)
*H01L 29/66* (2006.01)

(52) U.S. Cl.
CPC ... *H01L 21/02104* (2013.01); *H01L 21/02395* (2013.01); *H01L 21/02463* (2013.01); *H01L 21/02466* (2013.01); *H01L 21/02502* (2013.01); *H01L 21/02549* (2013.01); *H01L 21/02631* (2013.01); *H01L 29/201* (2013.01); *H01L 29/205* (2013.01); *H01L 29/207* (2013.01); *H01L 29/7787* (2013.01); *H01L 29/66462* (2013.01); *Y10T 428/26* (2015.01)

(56) References Cited

OTHER PUBLICATIONS

Snodgrass, William et al., "Performance Enhancement of Composition-Graded-Base Type-II InP/GaAsSb Double-Heterojunction Bipolar Transistors with ft>500 GHz", Applied Physics Letters, AIP, American Institute of Physics, Melville, NY, vol. 88, No. 22, May 30, 2006, pp. 222101-222101-3.

Bing-Ruey Wu et al., "Ultra-High Speed Composition Graded InGaAsSb/GaAsSb DHBTs with ft=500 GHz Grown by Gas-Source Molecular Beam Epitaxy", International Conference on Indium Phosphide and Related Materials Conference Proceedings, pp. 89-91, May 7-11, 2006, Princeton, NJ.

Lee, Kenneth E. et al., "High-Quality Metamorphic Compositionally Graded InGaAs Buffers", Journal of Crystal Growth, Elsevier, Amsterdam, Netherlands, vol. 312, No. 2, Jan. 1, 2010, pp. 250-257.

Ching-Sung Lee et al., "Investigations on InP/InAlAsSb/GaAs Metamorphic High Electron Mobility Transistors with a Dual-Composition-Graded InxGa1-xAs1-ySby Channel and Different Schottky-Barrier Gate Structures", Journal of the Electrochemical Society, vol. 158, No. 4, Jan. 1, 2011, pp. H452-H456.

Loesch, R et al., "Metamorphic Te-doped Al0.4In0.6Sb/Ga0.4In0.6Sb HEMT Structures for Low Power and High Frequency Applications," 2011 Compound Semiconductor Week & 23rd International Conference on Indium Phosphide and Related Materials, May 22-26, 2011, Berlin, Germany.

Loesch, R. et al., "Molecular Beam Epitaxial Growth of Metamorphic AlInSb/GaInSb Hing-Electron-Mobility-Transistor Structures on GaAs Substrates for Low Power and High Frequency Applications," Journal of Applied Physics, American Institute of Physics, New York, US, vol. 109, No. 3, Feb. 2, 2011, pp. 33706-33706-5.

* cited by examiner

Figure 2

| Function | Material | Thickness [nm] |
|---|---|---|
| Cover layer (cap) | $Ga_{0.4}In_{0.6}Sb$ | 5 |
| Barrier layer (barrier) | $Al_{0.4}In_{0.6}Sb$ | 10 |
| Doping layer (supply) | $Al_{0.4}In_{0.6}Sb:Te$ ($8 \times 10^{18}$ cm$^{-3}$) | 8 |
| Spacer layer (spacer) | $Al_{0.4}In_{0.6}Sb$ | 5 |
| Channel layer (channel) | $Ga_{0.4}In_{0.6}Sb$ | 15 |
| -15- AlInSb-buffer | $Al_{0.4}In_{0.6}Sb$ | 250 |
| -14- AlInAsSb-buffer | $Al_{0.4}In_{0.6}As_{1-x}Sb_x$  $x = 0 \rightarrow 1$ | 2000 |
| -13- AlGaInAs-buffer | $Al_{0.4}Ga_{1-y}In_yAs$  $y = 0 \rightarrow 0.6$ | 1200 |
| -12- carrier substrate | 4-inch semi-insulating GaAs substrate (4-inch semi-insulating GaAs substrate) | |

11

PSEUDO-SUBSTRATE FOR USE IN THE PRODUCTION OF SEMICONDUCTOR COMPONENTS AND METHOD FOR PRODUCING A PSEUDO-SUBSTRATE

BACKGROUND

The invention relates to a pseudo-substrate for use in the production of semiconductor components, and to a method for producing such a pseudo-substrate.

Semiconductor components, in particular for telecommunications and for high-speed applications, are typically produced by applying various layers onto substrates.

One essential criterion for the substrates used is in this case the lattice constant, which should be matched to the lattice constant of the layers to be applied. Often, however, corresponding substrates having the desired lattice constant are not available, or are not available with a sufficient quality, size or cost.

It is therefore known to employ pseudo-substrates for the crystal growth of layers for producing semiconductor components. In this case, commercially available substrates are typically used, for example Si or GaAs substrates, on which non-lattice-matched (metamorphic) and therefore defect-richer layers are deposited. With suitable process management and a sufficient layer thickness, a low-defect surface is thereby formed with a lattice constant different to that of the substrate. This newly generated surface is then used as a substrate for the growth of the layers of the actual component. For example, the use of GaAs substrates on which a metamorphic buffer layer consisting of indium, gallium and arsenic is applied in order to match the lattice constant is known, and described in Kenneth E. Lee, Eugene A. Fitzgerald, *"High-quality metamorphic compositionally graded InGaAs buffers"*, Journal of Crystal Growth 312 (2010) 250-257.

The aforementioned pseudo-substrates are employed particularly in the production of HEMTs (High Electron Mobility Transistors) and MMIC (Monolithic Microwafe Integrated Circuits). To this end, a use of the aforementioned buffer layers for producing a pseudo-substrate has already been described in A. Leuther, A. Tessmann, H. Massler, R. Loesch, M. Schlechtweg, M Mikulla, O. Ambacher, *"35 nm Metamorphic HEMT MMIC Technology"*, Proc. 20th Int. Conf. On Indium Phoshide and Related Materials, May 2008, paper MoA3.3" and A. Leuther, R. Weber, H. Dammann, M Schlechtweg, M Mikulla, M Walther, G. Weimann, *"Metamorphic 50 nm InAs-channel HEMT"*, Proc. 17th Int. Conf On Indium Phoshide and Related Materials, 2005, p. 129-132.

Since pseudo-substrates in principle have flaws and therefore defects inside the buffer layers, the risk arises that undesired electrical or optical properties, which restrict or exclude usability of the pseudo-substrates, will be induced in the event of an excessively high defect density. For example, in the event of a large lattice mismatch and a high defect density resulting therefrom, defect bands may be formed which influence the electrical and optical properties of the semiconductor component. In particular, an electrical conductivity resulting from the defect bands can render the pseudo-substrate unsuitable for radiofrequency applications.

SUMMARY

It is therefore an object of the invention to provide a pseudo-substrate for the production of semiconductor components, and in particular HEMTs and MMICs, and also a method for the production thereof which extends the range of available lattice constants and has a low-defect matching layer, preferably such that the pseudo-substrate is suitable for the formation of semiconductor components for radiofrequency applications.

This object is achieved by a pseudo-substrate for use in the production of semiconductor components, and by a method for producing such a pseudo-substrate according to the invention. Advantageous embodiments of the pseudo-substrate according to the invention, and advantageous embodiments of the method according to the invention may be found below.

The invention is based on the discovery by the Applicant that pseudo-substrates comprising the materials AlSb/InAs and AlInSb/(Ga)InSb are of interest for a range of semiconductor components, in particular HEMTs and MMICs for applications in the terahertz range. For this, however, no satisfactory substrates or pseudo-substrates are available. By the pseudo-substrate according to the invention and the method according to the invention, pseudo-substrates having lattice constants in the range of from 0.6136 nm to 0.6479 nm, which have significantly lower defect densities compared with previously known substrates, are made available for the first time.

The pseudo-substrate according to the invention comprises a carrier substrate having a crystalline structure, and a first buffer which is arranged on a surface of the carrier substrate, optionally on further intermediate layers lying between them. The first buffer may be formed as a single layer or as a multilayer system. The first buffer furthermore comprises arsenic (As) and at least one of the elements aluminum (Al) and indium (In) at least on the surface facing away from the carrier substrate.

What is essential is that a second buffer is additionally arranged on the side of the first buffer facing away from the carrier substrate, optionally on further intermediate layers lying between them. The second buffer may likewise be formed as a single layer or as a multilayer system.

The second buffer comprises arsenic and at least one of the elements aluminum and indium on a first surface facing toward the first buffer, and comprises antimony (Sb) and at least one of the elements aluminum and indium on a second surface facing away from the first buffer. To this end, the second buffer is formed with a decreasing arsenic content and an increasing antinomy content, respectively from the first surface to the second. It is within the scope of the invention for the increase and the decrease of the respective elements to take place continuously, in steps or in another fashion.

The method according to the invention for producing a pseudo-substrate for use in the production of semiconductor components comprises the application of a first buffer onto a surface of a carrier substrate having a crystalline structure, optionally with the interposition of further intermediate layers, the first buffer being formed as a single layer or as a multilayer system and being formed comprising arsenic (As) and at least one of the elements aluminum (Al) and indium (In) at least on the surface facing away from the carrier substrate. What is essential is that a second buffer, which is formed as a single layer or as a multilayer system, is additionally applied on the side of the first buffer facing away from the carrier substrate, optionally with the interposition of further intermediate layers, the second buffer being formed comprising arsenic (As) and at least one of the elements aluminum (Al) and indium (In) on a first surface facing toward the first buffer and comprising antimony (Sb) and at least one of the elements aluminum and indium on a second surface facing away from the first buffer. Furthermore, the second buffer is formed with a decreasing arsenic content and an increasing antinomy content, respectively from the first surface to the second.

The pseudo-substrate according to the invention is preferably produced by the method according to the invention or a preferred embodiment thereof. Likewise, the method according to the invention is preferably formed in order to produce the pseudo-substrate according to the invention or an advantageous embodiment thereof.

By the formation of the second buffer, in which a decreasing arsenic content and an increasing antinomy content are formed, it is therefore possible to achieve a pseudo-substrate for lattice constants in the range of 0.6136 nm (AlSb) and 0.6479 nm (InSb), which due to the special formation of the second buffer with an increasing antinomy content and decreasing arsenic content has significantly lower defect densities in comparison with previously known substrates or pseudo-substrates.

Semiconductor components can thereby be produced with higher quality with the pseudo-substrate according to the invention, since due to the lower defect density undesired electrical or optical changes in the property of the component are induced to a lesser extent or only negligibly. In particular, the low defect density makes it possible to produce a pseudo-substrate which is electrically insulating and therefore suitable for radiofrequency applications. In order to keep the defect density low, the second buffer is preferably formed in such a way that the relative change in the lattice constant as a function of distance perpendicularly to the first surface, from the first surface to the second surface, is always less than 1.5%/100 nm, preferably always less than 0.7%/100 nm, in particular always less than 0.35%/100 nm.

By this limitation of the change in the lattice constant as a function of distance, the defect density is also limited.

Preferably, the first and/or second buffer, particularly preferably both buffers, comprises at least indium. This makes a pseudo-substrate possible for the aforementioned lattice constants in the range of 0.6136 nm and 0.6479 nm.

The first buffer preferably constitutes a layer which is spatially separated from the second buffer. Preferably, the first and second buffers are immediately adjacent to one another. The first buffer preferably does not comprise antinomy. The thickness of the first buffer preferably lies in the range of from 0.1 µm to 5 µm.

In order to keep the defect density low, the second buffer is preferably formed in such a way that the percentage change in the arsenic content in relation to the total number of arsenic and antinomy atoms as a function of distance perpendicularly to the first surface, from the first surface to the second surface, is always less than 20%/100 nm, preferably always less than 6%/100 nm, in particular always less than 3%/100 nm.

In particular, studies by the Applicant have shown that very good optimization between minimization of the layer thickness on the one hand and minimization of the defect density on the other hand is achieved when the relative change in the lattice constant as a function of distance perpendicularly to the first surface lies in the range of from 0.3%/100 nm to 0.4%/100 nm, or the change in the arsenic content lies in the range of from 2.5%/100 nm to 3.5%/100 nm.

In order to further avoid defects, the second buffer is preferably formed with an antinomy content of less than 20%, preferably less than 10%, preferably without antinomy, on the first surface. The aforementioned percentages refer to the number of antinomy atoms in relation to the total number of antinomy and arsenic atoms.

As described above, in the pseudo-substrate according to the invention it is essential that, in the second buffer, from the first surface to the second surface, the arsenic content decreases and the antinomy content increases. It is within the scope of the invention to configure this increase and decrease stepwise. This is advantageous in particular when the device used is particularly suitable for the application of corresponding layers with respectively constant constituents, or a continuous increase and decrease cannot be produced.

In particular, however, it is advantageous for the second buffer at least partially to have a monotonic, preferably strictly monotonic, decrease in arsenic and conversely a monotonic, preferably strictly monotonic, increase in antinomy from the first surface to the second. In this way, for a predetermined maximum relative change in the lattice constant as a function of distance perpendicularly to the first surface, it is possible to achieve a reduction in the required total thickness of the second buffer, in particular compared with a stepwise profile of the increase and decrease. Therefore, it is in particular advantageous for the increase and the decrease respectively to have a linear profile.

The second buffer is preferably formed in such a way that the increase in antinomy and the decrease in arsenic are opposite, particularly in such a way that the ratio of antinomy and arsenic can always be described by $As_{1-y}Sb_y$, with $y \in [0, 1]$, i.e. y has values in the range of from 0 to 1 inclusive of the range limits, y increasing from the first surface to the second surface.

Preferably, the second buffer is formed as an $Al_xIn_{1-x}As_{1-y}Sb_y$ layer with constant $x \in [0,1]$, i.e. x has a value in the range of from 0 to 1 inclusive of the range limits, the second buffer being formed with an extraneous substance content of less than 10%, preferably less than 5%, in particular less than 1%, more preferably without further constituents. In this case, the % indications refer to the number of atoms of the extraneous substances in relation to the total number of atoms in the second buffer. Although the addition of further extraneous substances, for example doping atoms, below the aforementioned percentages by weight may be advantageous for many applications of the pseudo-substrate according to the invention, it is nevertheless particularly advantageous to form the pseudo-substrate without or with almost no further constituents, particularly in order to achieve a maximally electrically insulating configuration which is therefore suitable for radiofrequency applications.

Preferably, in the aforementioned composition, the change in the factor y as a function of distance perpendicularly to the first surface is less than 20%/100 nm, preferably less than 10%/100 nm, more preferably less than 6%/100 nm, even more preferably less than 3%/100 nm. In this way, a low defect density is ensured. In order to optimize a minimum layer thickness of the second buffer, on the one hand, and a low defect density on the other hand, a change in the factor y as a function of distance in the range of from 2.5%/100 nm to 3.5%/100 nm is particularly advantageous.

Likewise, in the aforementioned composition, y is preferably 0 on the first surface and/or 1 on the second surface, so that in particular there is no antinomy on the first surface and/or no arsenic on the second surface. A low defect density is thereby ensured for connection surfaces on the first buffer, on the one hand, and the semiconductor component on the other hand.

In particular, it is advantageous that, in the aforementioned composition, y increases monotonically, preferably strictly monotonically, from the first surface to the second surface. In particular, it is advantageous for y to increase linearly. In this case, for a predetermined maximum change in the lattice constant as a function of distance perpendicularly to the first surface, a minimum required total thickness of the second buffer is achieved.

Studies by the Applicant have shown that the second buffer preferably has a thickness in the range of from 1 µm to 10 µm, preferably in the range of from 1 µm to 3 µm, more preferably in the range of from 1.5 µm to 2.5 µm, particularly preferably about 2 µm. On the one hand, this provides a sufficiently large thickness in order to achieve the desired decrease in arsenic and increase in antimony in the second buffer with a low defect density. On the other hand, a thickness which is not too great is advantageous since material costs and in particular the production time is shortened.

The pseudo-substrate according to the invention makes it possible to produce high-quality semiconductor components by virtue of the accurately predeterminable properties of the second surface of the second buffer, particularly with the desired lattice constant in the aforementioned range. Studies by the Applicant have shown that a further increase in the surface quality is achieved in a preferred embodiment in that a layer comprising antimony and at least one of the elements aluminum and indium and not comprising arsenic is additionally arranged on the side of the second buffer facing away from the carrier substrate, optionally on further intermediate layers lying between them. This layer preferably has the same composition, i.e. the same elements in the same abundance, as the surface of the second buffer facing away from the first buffer.

Furthermore, studies by the Applicant have shown that the aforementioned additional layer is preferably arranged with a thickness in the range of from 0.05 µm to 0.5 µm, preferably in the range of from 0.2 µm to 0.3 µm, particularly preferably at about 0.25 µm. By this additional layer having a constant material composition, the surface quality, in particular the smoothness of the surface, is further increased and undesired perturbing effects are thereby additionally excluded during production of the semiconductor component.

In order to avoid undesired perturbing effects, it is advantageous for the first buffer to be arranged immediately adjacent to the second buffer, and/or for the first buffer to be arranged immediately adjacent to the carrier substrate.

Preferably, the first and second buffers have the same composition, i.e. the same elements in the same abundance, on the mutually adjoining surfaces.

The application of the aforementioned layers is carried out epitaxially in the method according to the invention. In particular, the application of methods known per se and the use of devices known per se is advantageous, in particular MBE (molecular beam epitaxy), MOCVD (metal organic chemical vapor deposition) or MOMBE (metal organic molecular beam epitaxy).

The composition of the first buffer, in particular the aluminum content and the indium content, is selected according to the desired lattice constant in the aforementioned ranges. In particular, it is advantageous to form the first buffer as an $Al_xIn_{1-x}As$ layer, with $x\epsilon[0,1]$ constant or varying in relation to the distance perpendicularly to the surface of the first buffer, the first buffer being formed with an extraneous substance content of less than 10%, preferably less than 5%, in particular less than 1%, more preferably without further constituents. In particular, the lattice constant is established in the aforementioned composition of the first buffer by the selection of the parameter with x.

Studies by the Applicant have shown that the second buffer is preferably carried out at a temperature in the range of from 300° C. to 600° C., preferably in the range of from 350° C. to 450° C., more preferably in the range of from 380° C. to 420° C., in particular at about 400° C.

In these temperature ranges, in particular at a temperature of about 400° C., the best surface properties, in particular the lowest roughness, were achieved in the production of a pseudo-substrate starting from a GaAs substrate.

Furthermore, tests by the Applicant have shown that, when using a production method in which the layers are produced under vacuum conditions, there is preferably a background pressure of less than or equal to $10^{-9}$ bar during the production of the second buffer.

BRIEF DESCRIPTION OF THE DRAWINGS

Other features and preferred configurations of the pseudo-substrate according to the invention and of the production method according to the invention will be explained below with the aid of the figures, in which:

FIG. 2 shows a tabular representation of a second exemplary embodiment of a pseudo-substrate according to the invention, in which an HEMT semiconductor component was additionally applied.

DETAILED DESCRIPTION OF THE PREFERRED EMBODIMENTS

Figure 1:
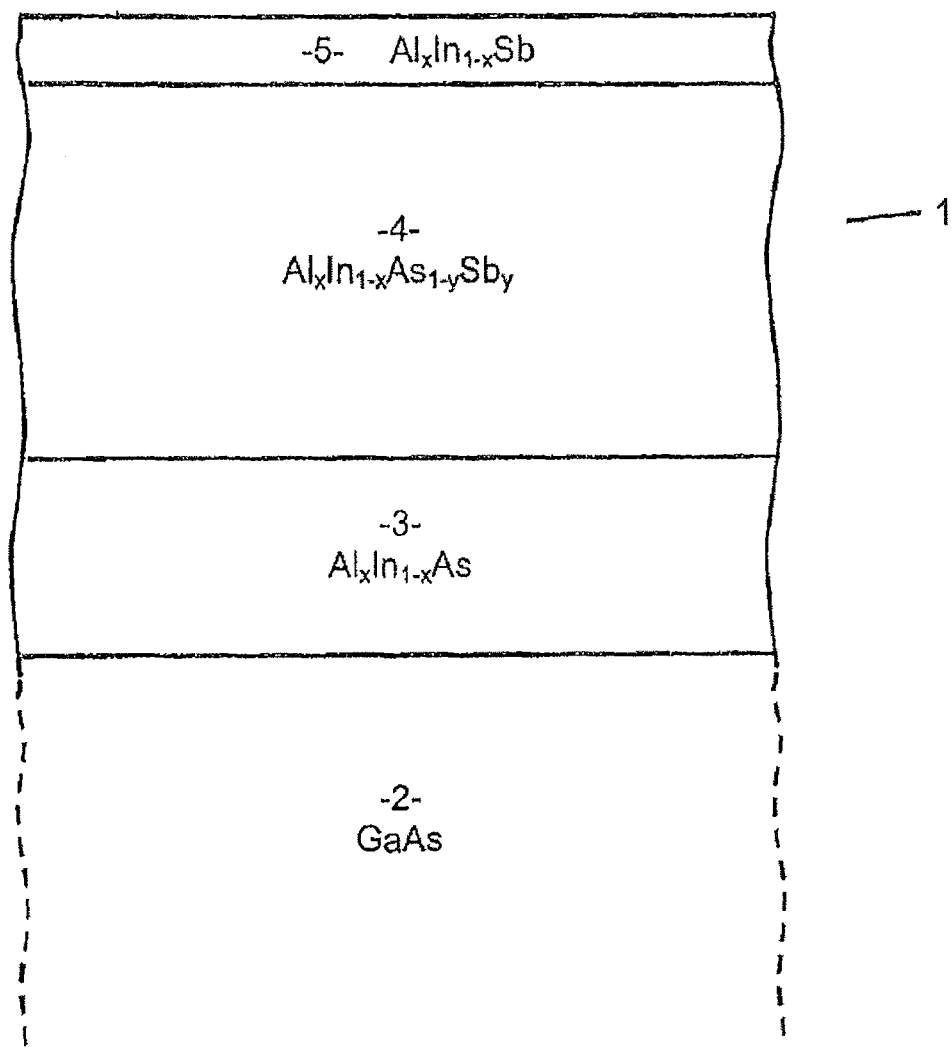
FIG. 1 shows a schematic representation of a first exemplary embodiment of a pseudo-substrate according to the invention.

FIG. 1 shows a schematic representation of a first exemplary embodiment of a pseudo-substrate 1 according to the invention. On a carrier substrate 2 formed as a GaAs substrate, a 1.2 µm thick layer is arranged which constitutes the first buffer 3. The first buffer 3 is formed as an $Al_xIn_{1-x}As$ layer.

A second buffer 4 formed as an $Al_xIn_{1-x}As_{1-y}Sb_y$ layer with a thickness of 2 µm is arranged on the side of the first buffer 3 facing away from the carrier substrate 2. An additional layer 5 formed as an $Al_xIn_{1-x}Sb$ layer with a thickness of 0.25 µm is arranged on the side of the second buffer 4 facing away from the first buffer 3.

The carrier substrate 2 has a thickness of 625 µm.

The factor x in the first exemplary embodiment is 0.6, which gives a lattice constant of about 0.634 nm.

What is essential is that, in the second buffer 4, the factor y is x=0 on the side facing toward the first buffer 3, increases linearly starting therefrom and is x=1 on the side of the second buffer 4 facing toward the additional layer 5. In the second buffer 4, there is therefore a continuous decrease in the arsenic content and conversely a continuous increase in the antimony content, from the side facing toward the first buffer 3 to the side facing toward the additional layer 5.

In this way, a transition from the first buffer to the additional layer 5 is ensured over a thickness of merely 2 µm with a relative change in the lattice constant as a function of distance of merely 3.25%/1 µm. A very low defect density and therefore a high quality of the carrier substrate, particularly for the formation of semiconductor components for radiofrequency ranges, are thereby achieved.

FIG. 2 shows a tabular representation of a second exemplary embodiment of a pseudo-substrate 11 according to the invention, onto which an HEMT semiconductor component was applied.

A first buffer 13 having a thickness of 1.2 μM, which is formed as an $Al_{0.4}Ga_{1-y}In_yAs$ layer, is arranged on a carrier substrate 12 formed as a GaAs substrate having a diameter of 4 inches. This first buffer 13 likewise has a composition varying with distance from the carrier substrate 12, the parameter y being y=0 on the side of the first buffer 13 facing toward the carrier substrate 12 and y=0.6 on the side of the first buffer 13 facing away from the carrier substrate 12. The change in the parameter y takes place linearly in this case. In this exemplary embodiment, a low defect density is therefore also achieved in the first buffer owing to a linear change in the composition, in this case by a decrease in the gallium content and an opposite increase in the indium content.

On the first buffer 13, a second buffer 14 formed as an $Al_{0.4}In_{0.6}As_{1-x}Sb_x$ layer is applied. The second buffer has a thickness of 2 μM and the parameter x increases linearly from the value x=0 on the side of the second buffer 14 facing toward the first buffer 13 to the value x=1 on the side of the second buffer 14 facing away from the first buffer 13.

An additional layer 15 formed as an $Al_{0.4}In_{0.6}Sb$ layer, which has a thickness of 0.25 μm, is arranged on the second buffer 14.

Figure 3:
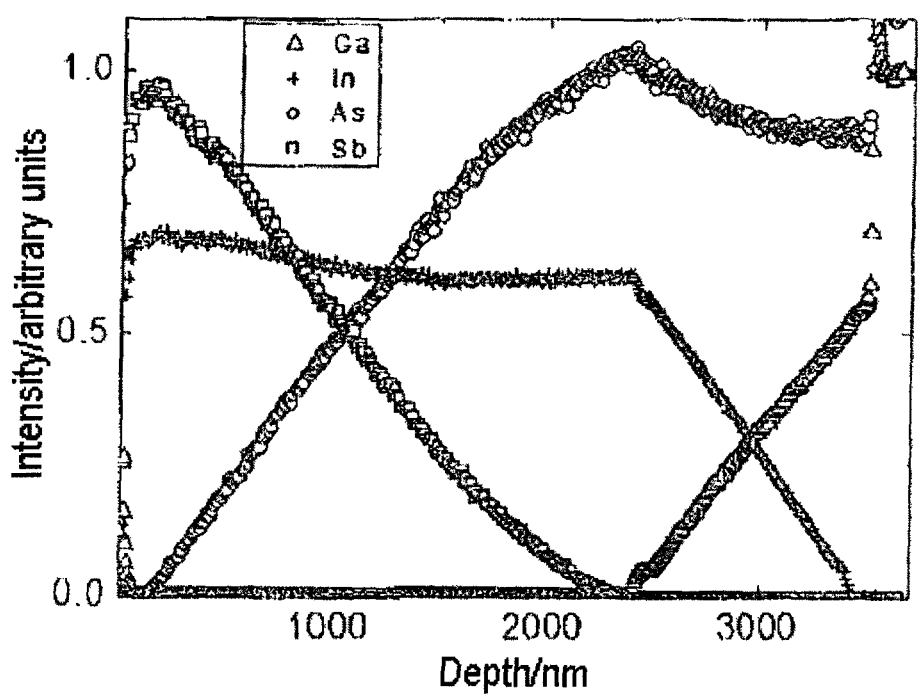
FIG. 3 shows the measured contents of gallium, indium, arsenic and antimony in the first and second buffers of the second exemplary embodiment in arbitrary units.

The measured profile of the gallium, indium, arsenic and antimony contents, starting from the side of the second buffer 14 facing away from the first buffer 13 (0 nm) in the direction of the carrier substrate 12, is represented in FIG. 3, the contents of the individual elements being represented in arbitrary units.

In the second buffer 14 (0 nm to about 2000 nm), the opposite decrease in antimony and increase in arsenic in the direction of the first buffer 13 can be seen clearly, with an approximately unchanged indium content. Likewise, in the first buffer 13 (2000 nm to about 3200 nm), the decrease in indium with an opposite increase in gallium in the direction of the carrier substrate 12 can be seen, with an approximately constant arsenic content.

The layer structure of the HEMT structure applied on the pseudo-substrate 11 is furthermore represented in FIG. 2:

On the additional layer 15, a channel formed as a $Ga_{0.4}In_{0.6}Sb$ layer with a thickness of 15 nm is arranged, then a spacer formed as an $Al_{0.4}In_{0.6}Sb$ layer with a thickness of 5 nm, then a supply formed as an $Al_{0.4}In_{0.6}Sb$ layer with a Te doping concentration of $8\times10^{18}$ $cm^{-3}$ with a thickness of 8 nm, then a barrier formed as an $Al_{0.4}In_{0.6}Sb$ layer with a thickness of 10 nm, and finally a cap formed as a $Ga_{0.4}In_{0.6}Sb$ layer with a thickness of 5 nm.

In this second exemplary embodiment, starting from a lattice constant of 0.565 nm of the carrier substrate 12, by linear matching both in the first buffer 13 and in the second buffer 14, a transition to a lattice constant of 0.634 nm was thus obtained, i.e. a change of about 12% in the lattice constant. The thicknesses of the first buffer 13 and of the second buffer 14 were selected in such a way that there is approximately the same relative change in the lattice constant as a function of distance both in the first buffer and in the second buffer.

This gives the advantage that a predetermined, or predetermined maximum, change in the lattice constant as a function of distance is achieved both for the first buffer and for the second buffer a minimum thickness and therefore a small total thickness of the first and second buffers.

The layers were in this case produced in an EPI 1040 MBE system, which is equipped with the per se known effusion cells for the group III elements gallium, aluminum and indium, as well as with valved cracker cells for $As_2$ and $Sb_2$. Tellurium was used as dopant.

A further reduction of the surface roughness was achieved by the additional layer 15. This was checked by optical microscopy, atomic force microscopy and a KLA Tencor surface measurement. Furthermore, the resistance of the additional layer 15 was measured as a quality feature by means of multipoint measurement. Manufacture of various samples at different process temperatures gave a minimum surface roughness at a process temperature of 400° C. and a maximum sheet resistance of the additional layer 15 at a temperature of 460° C.

The process temperature was in this case measured by means of a thermocouple.

In order to produce the second buffer 14, the arsenic supply flow was linearly reduced during the layer growth and the antimony supply flow was at the same time linearly increased oppositely. After production of the first buffer 13 and of the second buffer 14, the two layers were characterized by means of SIMS (Secondary Ion Mass Spectrometry). As described above, a plurality of samples were additionally produced with different process temperatures in the range of between 320° C. and 500° C. in order to determine the optimal process temperature.

The invention claimed is:

1. A pseudo-substrate (1, 11) for use in production of semiconductor components, comprising
   a carrier substrate (2, 12) having a crystalline structure, and a first buffer (3, 13) which is arranged on a surface of the carrier substrate, or on further intermediate layers lying there between,
   the first buffer (3, 13) being formed as a single layer or as a multilayer system and comprising arsenic (As) and at least one of the elements aluminum (Al) and indium (In) at least on a surface facing away from the carrier substrate (2, 12),
   a second buffer (4, 14), which is formed as a single layer or as a multilayer system, is additionally arranged on a side of the first buffer (3, 13) facing away from the carrier substrate (2, 12), or on further intermediate layers lying therebetween,
   the second buffer (4, 14) being formed comprising arsenic and at least one of the elements aluminum and indium on a first surface facing toward the first buffer, and comprising antimony (Sb) and at least one of the elements aluminum and indium on a second surface facing away from the first buffer (3, 13), and
   the second buffer (4, 14) being formed with a decreasing arsenic content and an increasing antimony content, respectively from the first surface to the second surface, and
   the second buffer (4, 14) is formed in such a way that a relative change in a lattice constant as a function of distance perpendicularly to the first surface, from the first surface to the second surface, is always less than 1.5%/100 nm.

2. The pseudo-substrate (1, 11) as claimed in claim 1, wherein the second buffer (4, 14) is formed with an antimony content of less than 20% on the first surface.

3. The pseudo-substrate (1, 11) as claimed in claim 1, wherein the second buffer (4, 14) has at least partially a stepwise decrease in arsenic and conversely a stepwise increase in antimony from the first surface to the second surface.

4. The pseudo-substrate (1, 11) as claimed in claim 1, wherein the second buffer (4, 14) at least partially has a monotonic decrease in arsenic and conversely a monotonic increase in antimony from the first surface to the second surface.

5. The pseudo-substrate (1, 11) as claimed in claim 1, wherein the second buffer (4, 14) is formed as an Al$_x$In$_{1-x}$As$_{1-y}$Sb$_y$ layer with constant x ∈ [0,1], the second buffer (4, 14) being formed with an extraneous substance content of less than 10%.

6. The pseudo-substrate (1, 11) as claimed in claim 5, wherein a change in the factor y as a function of distance perpendicularly to the first surface is less than 20%/100 nm.

7. The pseudo-substrate (1, 11) as claimed in claim 5, wherein at least one of the following conditions is met: y is 0 on the first surface or y is 1 on the second surface.

8. The pseudo-substrate (1, 11) as claimed in claim 5, wherein y increases monotonically from the first surface to the second surface.

9. The pseudo-substrate (1, 11) as claimed in claim 1, wherein the second buffer has a thickness in the range of from 1 μm to 10 μm.

10. The pseudo-substrate (1, 11) as claimed in claim 1, wherein an additional layer (5, 15) comprising antimony and at least one of the elements aluminum and indium and not comprising arsenic is additionally arranged on a side of the second buffer (4, 14) facing away from the carrier substrate (2, 12), or on further intermediate layers lying therebetween.

11. The pseudo-substrate (1, 11) as claimed in claim 1, wherein at least one of the first buffer (3, 13) is arranged immediately adjacent to the second buffer (4, 14), or the first buffer is arranged immediately adjacent to the carrier substrate (2, 12).

12. A method for producing a pseudo-substrate (1, 11) for use in the production of semiconductor components as claimed in claim 1, comprising the following method steps:
applying the first buffer (3, 13) onto the surface of the carrier substrate having a crystalline structure, or on the further intermediate layers, the first buffer being formed as a single layer or as a multilayer system and being formed comprising arsenic (As) and at least one of the elements aluminum (Al) and indium (In) at least on the surface facing away from the carrier substrate (2, 12),
applying the second buffer (4, 14), which is formed as a single layer or as a multilayer system,
on the side of the first buffer facing away from the carrier substrate (2, 12), or on the further intermediate layers,
the second buffer (4, 14) being formed comprising arsenic and at least one of the elements aluminum and indium on the first surface facing toward the first buffer (3, 13) and comprising antimony (Sb) and at least one of the elements aluminum and indium on the second surface facing away from the first buffer (3, 13),
the second buffer (4, 14) being formed with a decreasing arsenic content and an increasing antinomy content, respectively from the first surface to the second surface.

13. The method as claimed in claim 12, wherein the second buffer (4, 14) is formed in such a way that a relative change in a lattice constant as a function of distance perpendicularly to the first surface, from the first surface to the second surface, is always less than 1.5%/100 nm.

14. The method as claimed in claim 12, wherein the second buffer (4, 14) is formed with an antimony content of less than 20% on the first surface.

15. The method as claimed in claim 12, wherein the second buffer (4, 14) is at least partially formed having a monotonic decrease in arsenic and conversely a monotonic increase in antimony from the first surface to the second surface.

16. The method as claimed in claim 12, wherein the application of at least one of the first or second buffer is carried out by epitaxy.

17. The method as claimed in claim 12, wherein the application of the second buffer (4, 14) is carried out at a temperature in a range of from 300° C. to 600° C.

* * * * *